(12) United States Patent
Brunel

(10) Patent No.: US 7,333,554 B2
(45) Date of Patent: Feb. 19, 2008

(54) COMMUNICATION SYSTEM WITH FREQUENCY MODULATION AND A SINGLE LOCAL OSCILLATOR

(75) Inventor: Dominique Brunel, Caen (FR)

(73) Assignee: NXP B.V., Eindhoven (NL)

( * ) Notice: Subject to any disclaimer, the term of this patent is extended or adjusted under 35 U.S.C. 154(b) by 715 days.

(21) Appl. No.: 09/979,227

(22) PCT Filed: Mar. 14, 2001

(86) PCT No.: PCT/EP01/02906

§ 371 (c)(1),
(2), (4) Date: Nov. 19, 2001

(87) PCT Pub. No.: WO01/71934

PCT Pub. Date: Sep. 27, 2001

(65) Prior Publication Data

US 2002/0186713 A1   Dec. 12, 2002

(30) Foreign Application Priority Data

Mar. 21, 2000  (FR)  .................................. 00 03605

(51) Int. Cl.
*H04L 27/00* (2006.01)

(52) U.S. Cl. ...................... 375/295; 375/306

(58) Field of Classification Search ........... 375/219, 375/295, 272, 273, 274, 220, 358, 376, 221, 375/322, 373, 375, 362, 306, 215, 308, 327, 375/307; 455/86, 76, 78, 556, 553, 552, 455/83, 84, 127, 126, 119, 102; 370/277, 370/288, 276, 342, 345, 347, 320
See application file for complete search history.

(56) References Cited

U.S. PATENT DOCUMENTS

| 4,373,205 | A | * | 2/1983 | Mizota | ........................ 455/86 |
|---|---|---|---|---|---|
| 4,864,634 | A | * | 9/1989 | Nakagawa et al. | ........... 455/76 |
| 5,065,408 | A | | 11/1991 | Gillig | .............................. 375/8 |
| 5,430,416 | A | * | 7/1995 | Black et al. | ................. 332/145 |
| 5,793,819 | A | * | 8/1998 | Kawabata | .................... 375/344 |
| 5,825,813 | A | * | 10/1998 | Na | .............................. 375/219 |
| 5,907,590 | A | * | 5/1999 | Mogi | ........................... 377/48 |
| 5,978,662 | A | * | 11/1999 | Swales | ....................... 455/126 |
| 6,028,493 | A | * | 2/2000 | Olgaard et al. | ............. 332/103 |
| 6,118,984 | A | * | 9/2000 | Yu-Hong | ...................... 455/76 |
| 6,208,875 | B1 | * | 3/2001 | Damgaard et al. | ........ 455/552.1 |
| 6,246,286 | B1 | * | 6/2001 | Persson | ....................... 330/149 |

(Continued)

FOREIGN PATENT DOCUMENTS

JP         10164164 A      6/1998

(Continued)

Primary Examiner—Emmanuel Bayard

(57) ABSTRACT

A signal processing unit is described relates to a communication system by radio waves with frequency modulation comprising a signal processing unit, a transmission stage for transmitting a transmission signal in response to a modulated control signal and in response to a first frequency reference signal, a modulator connected between the processing unit and the transmission stage for forming the modulated control signal in response to an output signal of the processing device and in response to a second frequency reference signal and means for providing the first frequency signal to the transmission stage and for providing the second frequency reference signal to the modulator wherein the first and second frequency reference signal are derived from a signal oscillator.

8 Claims, 2 Drawing Sheets

U.S. PATENT DOCUMENTS

| | | |
|---|---|---|
| 6,256,511 B1 * | 7/2001 | Brown et al. ............. 455/552.1 |
| 6,366,620 B1 * | 4/2002 | Jackson et al. ............. 375/308 |
| 6,405,022 B1 * | 6/2002 | Roberts et al. ............... 455/76 |
| 6,442,380 B1 * | 8/2002 | Mohindra ................. 455/234.1 |
| 6,516,184 B1 * | 2/2003 | Damgaard et al. ............. 455/86 |
| 6,549,562 B1 * | 4/2003 | Olaker et al. ................ 375/139 |
| 6,564,039 B1 * | 5/2003 | Meador et al. ............... 455/76 |
| 6,584,090 B1 * | 6/2003 | Abdelgany et al. ......... 370/342 |
| 6,766,178 B1 * | 7/2004 | Damgaard et al. ........ 455/552.1 |
| 6,835,548 B2 * | 12/2004 | Fong et al. ................... 435/7.2 |
| 2003/0143960 A1 * | 7/2003 | Yamawaki et al. ............ 455/86 |

FOREIGN PATENT DOCUMENTS

| | | |
|---|---|---|
| WO | 9638924 A1 | 12/1996 |
| WO | 9927689 A2 | 6/1999 |

* cited by examiner

COMMUNICATION SYSTEM WITH FREQUENCY MODULATION AND A SINGLE LOCAL OSCILLATOR

FIELD OF THE INVENTION

The invention relates to a communication system by radio waves with frequency modulation.

The system according to the invention may be a simple transmitter system or a transmitter and receiver system for communication signals.

Although the invention may be used for the transmission of any type of data, it is particularly applicable to the realization of mobile telephones.

Applications in other types of equipment provided with modems are equally possible.

DESCRIPTION OF THE PRIOR ART

The attached FIG. 1 is a simplified diagrammatic picture of a communication system of a known type. It shows in particular the transmission path of such a system.

The communication system comprises essentially a transmission stage 10, a signal processing unit 20, and a modulator 30 connected between the processing unit 20 and the transmission stage 10. These three elements will be briefly described below.

In the case of mobile telephones, the signal processing unit 20 is a unit capable of converting acoustic signals into electrical signals, and vice versa. The signal processing unit is usually a digital processing unit. It is accordingly associated with digital-analog converters 22. In alternative applications, the signal processing unit 20 may also be a computer.

In a specific example illustrated in FIG. 1, the processing unit delivers an output signal, called baseband signal, which is transmitted over two paths 24a and 24b. The two paths carry the signals in phase and in phase quadrature, respectively. These signals are commonly referred to as signals I and Q.

The signals I and Q are transmitted to the modulator 30 which recombines them so as to supply a signal, modulated in phase, which is applied to the output stage. This signal will be simply referred to as "modulated control signal" hereinafter. To carry out this operation, the modulator 30 must receive a frequency reference signal at a frequency referred to as intermediate frequency. The intermediate frequency signal is applied to mixers (not shown) of the modulator. It is provided by a local oscillator whose operation will be described further below.

The transmission stage 10 is constructed around a phase-locked loop 12 comprising substantially a transmission oscillator 14, a mixer 15, a phase-frequency comparator 16, and a low-pass filter 17.

The transmission oscillator 14 is a voltage-controlled oscillator (VCO) which supplies a transmission signal at a terminal 8 which is connected to a transmission antenna (not shown). The signal transmitted by the transmission oscillator 14 is also provided to the mixer 15 which mixes it, through addition or subtraction, with a second frequency reference signal. This second frequency reference signal, distinct from the intermediate frequency signal referred to above, is supplied by a second local oscillator. This oscillator will be described further below.

The phase-frequency comparator 16 compares a signal which it receives from the mixer 15 with the modulated control signal originating from the modulator 30, and controls the oscillator 14 to which it is connected by way of the filter 17. The filter 17 essentially serves to remove a component corresponding to the intermediate frequency from the control input of the oscillator.

As was noted above, the transmitter stage 10 and the modulator 30 accordingly require respective frequency reference signals.

Such a signal is supplied to the transmitter stage 10 by a first phase-locked loop 42 referred to as radio frequency loop. The radio frequency loop essentially comprises a first local oscillator 44 of the VCO type, a first frequency divider 49 with a ratio N, a phase-frequency comparator 46, and a low-pass filter 47. In the example shown in the Figure, the elements are connected in the loop in the order given above.

The phase-frequency comparator 46 controls the local oscillator 44 by comparing its oscillation frequency with a reference frequency supplied by a quartz device 60. The frequency of the quartz may be applied to the comparator through a second frequency divider 62 having a ratio R. The latter enables in a simple manner to adapt the reference frequency to that required for the phase-frequency comparator 46.

The first frequency divider 49 enables to select a transmission frequency and thus a transmission channel. The division ratio N may be an integer ratio. It authorizes frequency jumps having an integer value, for example corresponding to a transmission band.

The local oscillator 44 controlled by the comparator 46 supplies its frequency reference signal to the mixer 15 of the transmission stage. This signal is referred to as radio frequency signal.

A second phase-locked loop 52 distinct from the first loop 42 is provided for supplying the intermediate frequency signal to the modulator.

In a manner comparable to that of the first loop, the second loop 52 comprises in that order a second local oscillator 54, a third frequency divider 59, a phase-frequency comparator 56, and a filter 57. The phase-frequency comparator 56 also receives a reference frequency from the quartz device 60, possibly with an interposed fourth frequency divider 63 with a ratio R' which is different from the ratio R of the second divider 62.

The third frequency divider 59, i.e. the divider connected to the phase-frequency comparator 56, enables to tune the loop 52 to the intermediate frequency desired for controlling the modulator 30. This frequency is supplied to the modulator by the second local oscillator 54.

A transmission path in accordance with FIG. 1 causes a certain number of problems. In particular, parasitic responses of the transmission stage may result from a plurality of possible combinations of the intermediate frequency signal and the radio frequency signal delivered by the two local oscillators 44 and 54.

Furthermore, it is necessary to have the modulator operate at an intermediate frequency which is very high so as to be able to eliminate the components of this frequency by means of the low-pass filter 17 of the transmission stage. This is the more difficult as the transmission frequency is also high.

Finally, it is observed that in addition to the transmission oscillator 14 of the transmission stage, the device comprises two local oscillators 44, 54 associated with respective phase-locked loops.

For certain applications, such as the application of mobile telephones, a high number of oscillators and phase-locked loops leads to bulk and a high power consumption. These constraints are not compatible with the requirement of miniaturization of devices.

A further illustration of the prior art can be found in WO-A-99 27 689, WO A 96 38 924, U.S. Pat. No. 5,065,408, JP A 10 164 164. These documents indicate the operation of various members of the communication system as well as alternative possibilities of realizing such a system.

BRIEF DESCRIPTION OF THE INVENTION

The invention has for its object to provide a communication system of the transmitter type or of the transmitter and receiver type which does not involve the problems mentioned above.

It is a particular object to provide such a system of which the bulk and the electric power consumption can be reduced.

It is another object to avoid any parasitic combination between the radio frequency signal and the intermediate frequency signal which could coincide with the transmission frequency and thus interfere with the transmission stage.

A final object is to avoid that the intermediate frequency could be reproduced in the loop of the transmission stage.

To achieve these objects, the invention more precisely relates to a communication system by radio waves with frequency modulation, comprising:

a signal processing unit, a transmission stage for transmitting a transmission signal in response to a modulated control signal and in response to a first frequency reference signal, a modulator connected between the processing unit and the transmission stage for forming the modulated control signal in response to an output signal of the processing device and in response to a second frequency reference signal, and means for providing the first frequency reference signal to the transmission stage and for providing the second frequency reference signal to the modulator.

According to the invention, said means for providing the first and the second frequency reference signal comprise a single local oscillator.

It is possible, thanks to the use of a single local oscillator, and thus of a single phase-locked loop, to reduce the bulk and the power consumption of the system.

Moreover, any undesirable combination of frequencies can no longer disturb the transmission stage because the frequency reference signals for the transmission stage and the modulator are obtained from one and the same oscillator.

Finally, the choice of a single frequency having a comparatively high value for the local oscillator renders it easier to eliminate this frequency from the transmitter stage by means of a suitable low-pass filter.

The local oscillator may be associated with a phase-locked loop including a first frequency divider for selecting, for example, the first reference frequency.

The frequency divider may be a divider with a division ratio which is an integer number or, preferably, a fractional ratio, i.e. non-integer. A fractional ratio enables it to obtain jumps of integer value in the transmission frequency, as will become clear from the text further below.

The first and second reference frequencies necessary for the transmission stage and the modulator may be obtained from the single local oscillator by associating the latter with one or several suitable frequency dividers located outside the phase-locked loop.

In a particular embodiment illustrated below, the local oscillator may be directly connected to the transmission stage and may be connected to the modulator via a second frequency divider.

The communication system according to the invention may be a simple transmitter, or may be of the transmitter-receiver type. In the latter case, it comprises in addition a reception stage for providing a reception signal to the processing unit.

The reception stage may comprise a demodulator to which a frequency reference signal is also to be supplied.

This signal may be supplied by an autonomous local oscillator. However, in accordance with a particular advantageous aspect of the invention, the frequency reference signal for the demodulator may also be provided by the single local oscillator used for the modulator and the transmission stage.

Further characteristics and advantages of the invention will become clear from the following description which is given with reference to the Figures in the annexed drawing. This description is given purely by way of illustration and is non-limitative.

DETAILED DESCRIPTION OF EMBODIMENTS

Figure 1:
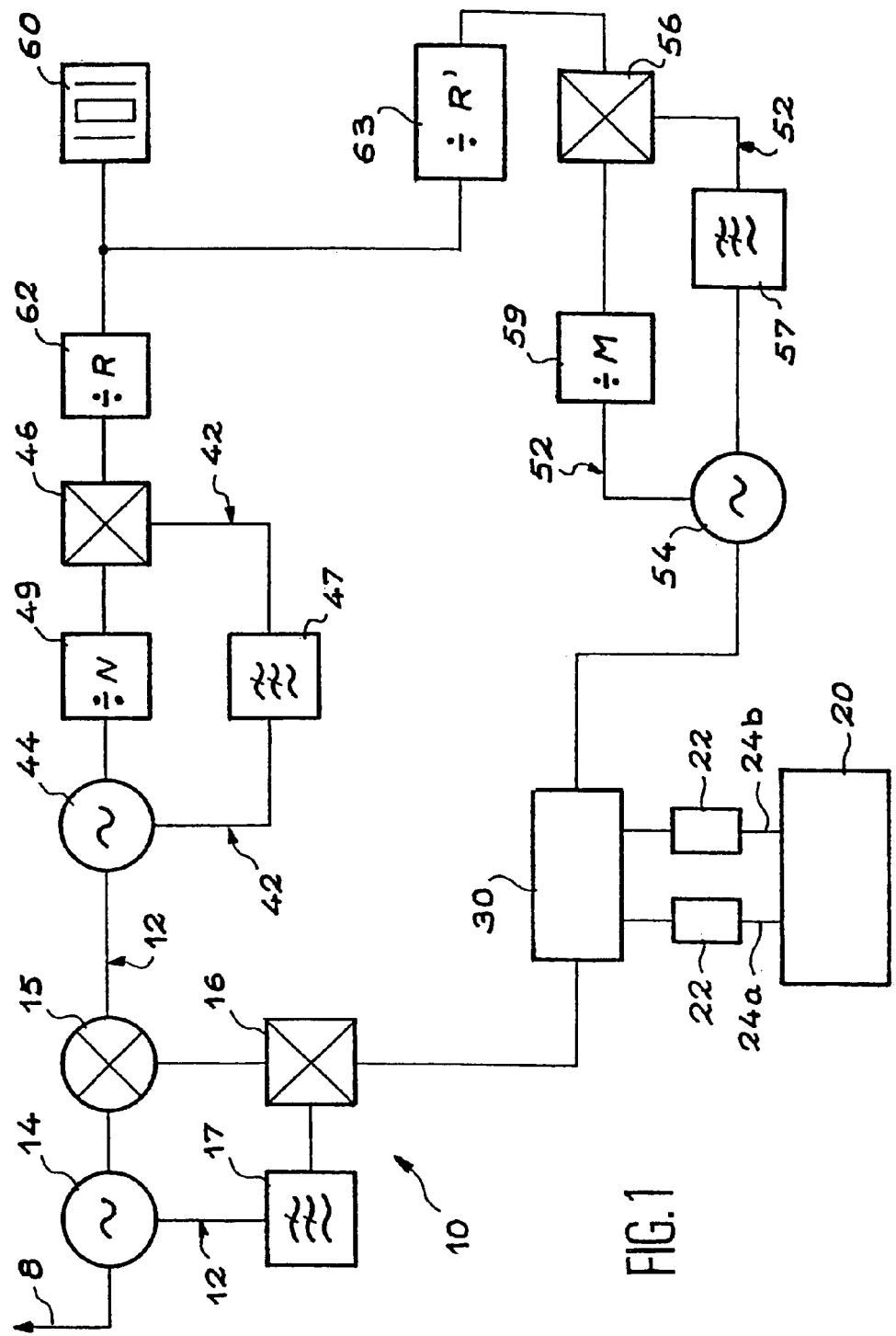
FIG. 1, described above, diagrammatically shows a transmission path of a communication system of known type.
Figure 2:
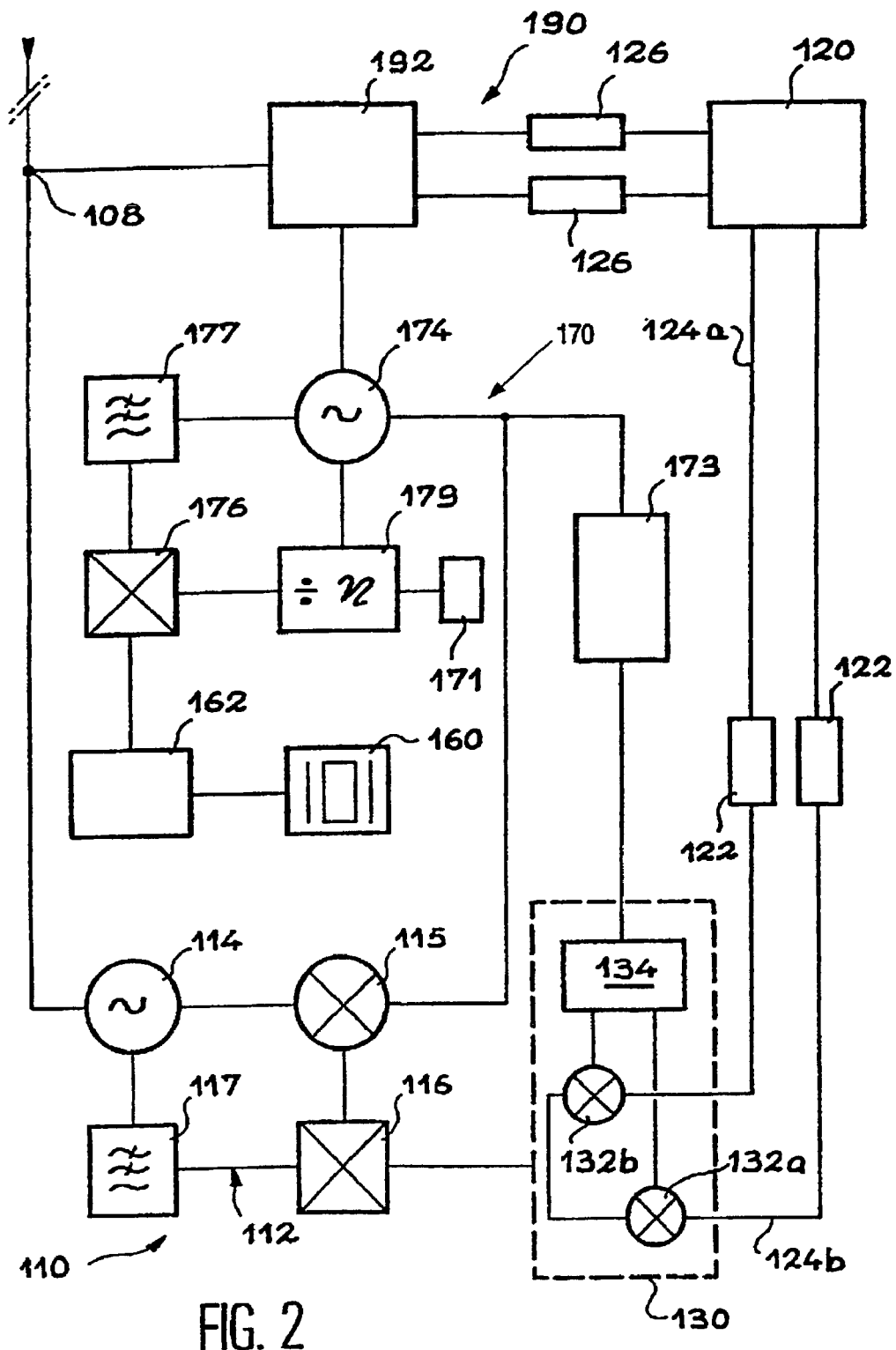
FIG. 2 diagrammatically shows a particular embodiment of a communication system according to the invention.

To simplify the description of FIG. 2, elements in this Figure which are identical, similar, or equivalent to elements of FIG. 1 have been given the same reference numerals to which 100 has been added.

The transmission stage 110 in FIG. 2 is constructed around a phase-locked loop 112 comprising in that order a transmission oscillator 114, a mixer 115, a phase-frequency comparator 116, and a low-pass filter 117.

The transmission oscillator 114 of the VCO (Voltage-Controlled Oscillator) type is controlled by the phase-frequency comparator 116 and delivers a transmission signal with a frequency $f_{TX}$ at an output terminal 108. The output terminal is connected to an antenna (not shown).

The signal with the frequency $f_{TX}$ is also applied to the mixer 115. The latter receives in addition a first frequency reference signal, for example of the radio frequency type, which originates from the single local oscillator 174 which will be described further below. The reference signal, with a frequency $f_{lO}$, is mixed with the transmission signal so as to provide to the phase-frequency comparator 116 a mixed signal with a frequency $f_{TX}$-$f_{lO}$.

The phase-frequency comparator 116 further receives a modulated control signal originating from the modulator 130. The signal of the modulator has a frequency which is fixed by the frequency reference signal applied thereto. Yet the frequency reference signal originates from the single local oscillator 174 and passes through a frequency divider 173 with a division ratio Z. The frequency of the reference signal and that of the modulated signal applied to the phase-frequency comparator 116 is accordingly $f_{lO}$/Z. The frequency $f_{lO}$, for example of the order of the Gigahertz, is sufficiently high for authorizing a choice of the ratio Z such that the component $f_{lO}$/Z can be filtered in the low-pass filter 117 without eliminating the transmission signal.

It is apparent from FIG. 2 that the frequency reference signal, after passing through the frequency divider 173, is applied to two mixers 132a, 132b of the modulator 130. A 90° phase-shifting device referenced 134 enables to apply the frequency reference signal to two mixers, in phase and in phase quadrature, respectively. The mixers 132a, 132b enable a recombination of the signals I and Q transmitted over two output paths 124a, 124b of the signal processing unit 120.

Reference numeral 122 is a general indication of digital-analog converter circuits and signal-shaping circuits connected in series in the output path.

The operation of the local oscillator will not be examined in detail.

The local oscillator 174 is connected in a phase-locked loop 170 which comprises, besides the local oscillator, a frequency divider 119 with a variable ratio N, a phase-frequency comparator 176, and a low-pass filter 177. These elements are connected in the loop in the order given above.

The local oscillator 174 of the VCO type is controlled by the phase-frequency comparator 176 which compares the frequency of the local oscillator 174 with a reference frequency given by a quartz oscillator 160.

The frequency reference provided by the quartz may be applied to the phase-frequency comparator 176 via a frequency divider 162 (distinct fr 179 of the loop 170).

The frequency divider 179 of the phase-locked loop 170 has a division ratio N which is adjustable by means of a frequency selector 171. By modifying the division ratio N, it is possible to modify the frequency applied to the input of the phase-frequency comparator 176, and thus to modify the oscillation frequency $f_{lo}$ of the local oscillator. Now since the signal of the local oscillator is applied to the transmission stage, a modification of the frequency $f_{lo}$ also enables a change in the transmission channel.

The modification of the ratio N may take place through increments or decrements, for example changing from N to N+1 or to N−1, and leads to modifications in the frequency of the local oscillator 174, referenced $\Delta f_{lo}$.

This modification leads to a modification of the transmission frequency, which is referenced $\Delta f_{TX}$.

The frequency modifications $\Delta f_{lo}$ and $\Delta f_{Tx}$ have the following interrelationship:

$$\Delta f_{lo} = \Delta f_{TX} \cdot (Z \pm 1)/Z$$

wherein Z is the division ratio of the frequency divider 173 connected between the local oscillator 174 and the modulator 130. (This expression is to be read with the sign "+" in the case of an infradyne operation of the loop 170 and with the sign "−" in the case of a supradyne operation).

In view of the relation between $\Delta f_{lo}$ and $\Delta f_{TX}$, it is possible to choose fractional, i.e. non-integer values for at least one of the division ratios N and/or Z for obtaining integer variations in the value of $\Delta f_{Tx}$.

In a particular embodiment discussed below, in which the local oscillator 174 is also used for providing a frequency reference to a reception stage, a fractional ratio N is preferably chosen for the divider of the phase-locked loop 170. In that case the ratio Z may be chosen to be an integer number, preferably equal to 2 or a multiple of 4, so as to facilitate the formation of frequency reference signals in quadrature for the modulator 130.

In the example of FIG. 2, a reception stage 190 comprises essentially a demodulator 192 with direct conversion which is connected between the terminal 108 receiving an antenna signal and the signal processing unit 120. Reference numeral 126 indicates circuits for signal shaping and for analog-digital conversion of the signals transmitted by the demodulator and directed towards the processing unit 120. The demodulators for direct conversion, which are known per se, are designated "zero IF" or "low IF" ("demodulation at zero intermediate frequency" or "demodulation at low intermediate Frequency"). This is illustrated, for example, in the cited documents WO A 96 38 924 and JP A 10 164 164.

The demodulator 192 receives the frequency reference signal $f_{lo}$ directly from the local oscillator 174. Thus, a modification of the division ratio of the frequency divider 179 leads to a modification not only of the transmission frequency but also of the reception frequency. A fractional division ratio, as noted above, enables to obtain jumps of integer value in the transmission and reception frequencies.

The invention claimed is:

1. A communication system by radio waves with frequency modulation, comprising:
   a signal processing unit (120),
   a transmission stage (110) for transmitting a transmission signal in response to a modulated control signal and in response to a first frequency reference signal, comprising:
      a phase-locked loop (112) including a low-pass filter (117), and
   a modulator (130) connected between the processing unit (120) and the transmission stage (110) for forming the modulated control signal in response to an output signal of the processing unit (120) and in response to a second frequency reference signal,
   a single local oscillator (174) in communication with:
      a phase-locked loop (170) which comprises a first frequency divider (179) for selecting the first reference frequency to be applied to the transmission section; and
      a second frequency divider for selecting the second reference frequency which is applied the modulator, wherein at least one of the first and second frequency dividers possesses a fractional division ratio.

2. A system as claimed in claim 1, wherein the first frequency divider (179) has a division ratio N.

3. A system as claimed in claim 1, wherein the local oscillator (174) is directly connected to the transmission stage (110).

4. A system as claimed in claim 1, wherein the second frequency divider has a division ratio Z such that the frequency of the second frequency reference signal is eliminated in said low-pass filter.

5. A system as claimed in claim 1, comprising in addition a reception stage (190) for providing a reception signal to the processing unit (120).

6. A system as claimed in claim 5, comprising a demodulator (190) with direct conversion for supplying the reception signal in response to an antenna signal and in response to a third frequency reference signal.

7. A system as claimed in claim 6, wherein the local oscillator (174) is in addition connected to a demodulator (190) for providing to said demodulator the third frequency reference signal.

8. A mobile telephone utilizing a communication system as claimed in claim 1.

* * * * *